(12) United States Patent
Kim et al.

(10) Patent No.: US 12,205,519 B2
(45) Date of Patent: Jan. 21, 2025

(54) GATE DRIVING CIRCUIT AND ELECTROLUMINESCENT DISPLAY DEVICE USING THE SAME

(71) Applicant: LG Display Co., Ltd., Seoul (KR)

(72) Inventors: Minsu Kim, Goyang-si (KR); SeHwan Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/309,699

(22) Filed: Apr. 28, 2023

(65) Prior Publication Data

US 2023/0267872 A1    Aug. 24, 2023

Related U.S. Application Data

(63) Continuation of application No. 17/555,799, filed on Dec. 20, 2021, now Pat. No. 11,676,528.

(30) Foreign Application Priority Data

Dec. 23, 2020   (KR) .................. 10-2020-0181933

(51) Int. Cl.
*G09G 3/30*    (2006.01)

(52) U.S. Cl.
CPC ....... *G09G 3/30* (2013.01); *G09G 2300/0842* (2013.01); *G09G 2310/0267* (2013.01); *G09G 2310/08* (2013.01); *G09G 2320/0214* (2013.01); *G09G 2320/0233* (2013.01)

(58) Field of Classification Search
CPC .................. G09G 3/30; G09G 2310/0267
See application file for complete search history.

(56) References Cited

U.S. PATENT DOCUMENTS

| | | | |
|---|---|---|---|
| 2016/0035277 A1 | 2/2016 | Han et al. | |
| 2017/0116925 A1* | 4/2017 | Lee ..................... | G09G 3/3275 |
| 2019/0066604 A1 | 2/2019 | Kong et al. | |
| 2019/0156732 A1* | 5/2019 | Kong .................. | G09G 3/3266 |
| 2022/0069044 A1 | 3/2022 | Kwak et al. | |

FOREIGN PATENT DOCUMENTS

| | | | | |
|---|---|---|---|---|
| CN | 105321472 | * | 2/2016 | .......... G09G 3/3233 |
| CN | 105321472 A | | 2/2016 | |
| KR | 10-2015-0059604 A | | 6/2015 | |
| KR | 10-2017-0047633 A | | 5/2017 | |
| KR | 10-2018-0004369 A | | 1/2018 | |

* cited by examiner

*Primary Examiner* — Towfiq Elahi
(74) *Attorney, Agent, or Firm* — Seed IP Law Group LLP

(57) ABSTRACT

Provided is an electroluminescent display device. The electroluminescent display device includes a pixel circuit implemented with a plurality of transistors, and a gate driving circuit that provides a scan signal, an initialization signal, and an emission signal to the pixel circuit. The gate driving circuit includes a scan signal generating circuit that provides the scan signal to a gate electrode of at least one of the plurality of transistors, an initialization signal generating circuit that provides the initialization signal to a source electrode or a drain electrode of at least one of the plurality of transistors, and the emission signal generating circuit that provides an emission signal to the gate electrode of at least one of the plurality of transistors. The initialization signal generating circuit receives an output signal of the scan signal generating circuit and an output signal of the emission signal generating circuit.

9 Claims, 9 Drawing Sheets

GATE DRIVING CIRCUIT AND ELECTROLUMINESCENT DISPLAY DEVICE USING THE SAME

CROSS-REFERENCE TO RELATED APPLICATIONS

This application is a continuation of U.S. patent application Ser. No. 17/555,799, filed Dec. 20, 2021, which claims the benefit of Korean Patent Application No. 10-2020-0181933 filed on Dec. 23, 2020 in the Republic of Korea, the entire contents of which are hereby expressly incorporated by reference into the present application.

BACKGROUND

Technical Field

The present disclosure relates to a simplified gate driving circuit and an electroluminescence display device using the same.

Description of the Related Art

In accordance with the development of information technology, the market for display devices that are connection media between users and information, is growing. Accordingly, the use of various types of display devices such as an electroluminescent display device, a liquid crystal display device, an organic light emitting display device, and a quantum dot display device is increasing.

Among them, the electroluminescent display device has advantages in terms of a fast response speed, high luminous efficiency, and a large viewing angle. In general, the electroluminescent display device applies a data voltage to a gate electrode of a driving transistor using a transistor turned on by a scan signal, and charges the data voltage supplied to the driving transistor in a storage capacitor. Then, the data voltage charged in the storage capacitor is output using an emission signal so that emission elements emit light. The emission elements may include an organic light emission element, an inorganic light emission element, and a quantum dot element.

In the electroluminescent display device, pixels each including the emission element are arranged in a matrix form and luminance of the pixels is adjusted according to a gray level of video data.

Each of the pixels includes the emission element, a driving transistor for controlling a driving current flowing through the emission element according to a gate-source voltage, and at least one switch transistor for programming the gate-source voltage of the driving transistor.

BRIEF SUMMARY

As the electroluminescent display device continues to be driven, a hysteresis phenomenon in which a threshold voltage Vth of the driving transistor changes occurs. In order to alleviate the hysteresis phenomenon of the driving transistor, it is beneficial to apply on bias stress to the driving transistor. In order to apply on bias stress to the driving transistor, it is beneficial to adjust a voltage level of the initialization signal even in one frame. Accordingly, a separate initialization signal generating circuit for swinging the initialization signal can be included in a gate driving circuit. Further, since the electroluminescent display device includes a separate circuit for applying on bias stress in the gate driving circuit, a bezel increases and driving power consumption increases. The inventors of the present disclosure have identified one or more technical problems in the related art including the above problem and suggested one or more embodiments capable of overcoming the problems in the related art.

An electroluminescent display device includes a display panel which is a minimum device for displaying an image, and a pixel array is disposed in the display panel to display an image. The display panel may be divided into a display area where an image is displayed and a non-display area where an image is not displayed. The pixel array may be disposed in the display area, and a gate driving circuit for providing at least one emission signal and a scan signal to the pixel array may be disposed in the non-display area.

The gate driving circuit is attached to the display panel in the form of a chip on film or chip on glass, or may be implemented in the form of a gate-in-panel (hereinafter, referred as to GIP) that is formed by a combination of thin film transistors in a bezel area which is the non-display area of the display panel. The gate driving circuit in the form of GIP includes gate signal generating circuits corresponding to the number of gate lines, and each gate signal generating circuit outputs a gate pulse that is supplied to the gate line corresponding thereto on a one-to-one basis. The gate line supplies a gate signal to the pixel array disposed in the display area, so that an emission element can emit light. Accordingly, as the number of gate signals to be supplied to the pixel array increases, a configuration of the gate driving circuits is complicated and has a large area, which may increase a bezel of the display panel.

Also, as described above, in order to apply on bias stress to the pixel array, the configuration of the gate driving circuit may be complicated and the bezel may be increased.

Accordingly, one or more embodiments of the present disclosure provide a gate driving circuit capable of applying on bias stress to a driving transistor while allowing for a reduction in a non-display area of a display panel, and an electroluminescent display device using the same.

Technical benefits of the present disclosure are not limited to the above-mentioned benefits, and other benefits, which are not mentioned above, can be clearly understood by those skilled in the art from the following descriptions.

An electroluminescent display device according to an embodiment of the present disclosure includes a pixel circuit implemented with a plurality of transistors, and a gate driving circuit that provides a scan signal, an initialization signal, and an emission signal to the pixel circuit. The gate driving circuit includes a scan signal generating circuit for providing the scan signal to a gate electrode of at least one of the plurality of transistors, an initialization signal generating circuit for providing the initialization signal to a source electrode or a drain electrode of at least one of the plurality of transistors, and the emission signal generating circuit for providing an emission signal to the gate electrode of at least one of the plurality of transistors. The initialization signal generating circuit receives an output signal of the scan signal generating circuit and an output signal of the emission signal generating circuit. The initialization signal generating circuit and the emission signal generating circuit include an n-type transistor and a p-type transistor. Accordingly, a bezel of the electroluminescent display device may be reduced by simplifying the gate driving circuit.

A gate driving circuit according to an embodiment of the present disclosure includes a first pull-down unit controlled by a Q node, a first pull-up unit controlled by a QB node, a second pull-up unit controlled by a Q' node, a second pull-down unit controlled by a QB node, a Q node inverter electrically connected to the Q node and the QB node to provide a reversal voltage of the Q node to the QB node, a Q' node inverter electrically connected to the Q' node and the QB' node to provide a reversal voltage of the Q' node to the QB' node, and an emission signal inverter electrically connected to the Q' node to provide a scan signal or a voltage having a phase opposite to that of an emission signal to the Q' node. The first pull-down unit and the first pull-up unit output the emission signal, and the second pull-up unit and the second pull-down unit output an initialization signal. Accordingly, the gate driving circuit can be simplified to thereby allow for a reduction in an area where the gate driving circuit is disposed.

Other detailed matters of the embodiments are included in the detailed description and the drawings.

According to embodiments of the present disclosure, a gate driving circuit can be simplified and a bezel of an electroluminescent display device can be reduced by using an emission signal generating circuit that generates an emission signal without including a separate generating circuit that swings an initialization signal for applying on bias stress.

And, according to embodiments of the present disclosure, by implementing a gate driving circuit including both an n-type transistor and a p-type transistor, the gate driving circuit can be simplified and a bezel of an electroluminescent display device can be reduced.

And, according to embodiments of the present disclosure, an emission signal generating circuit and an initialization signal generating circuit are implemented using a Q node or Q' node or an emission signal inverter, so that a gate driving circuit can be simplified and a bezel of an electroluminescent display device can be reduced.

The effects according to the present disclosure are not limited to the contents exemplified above, and more various effects are included in the present specification.

DETAILED DESCRIPTION

Figure 1:
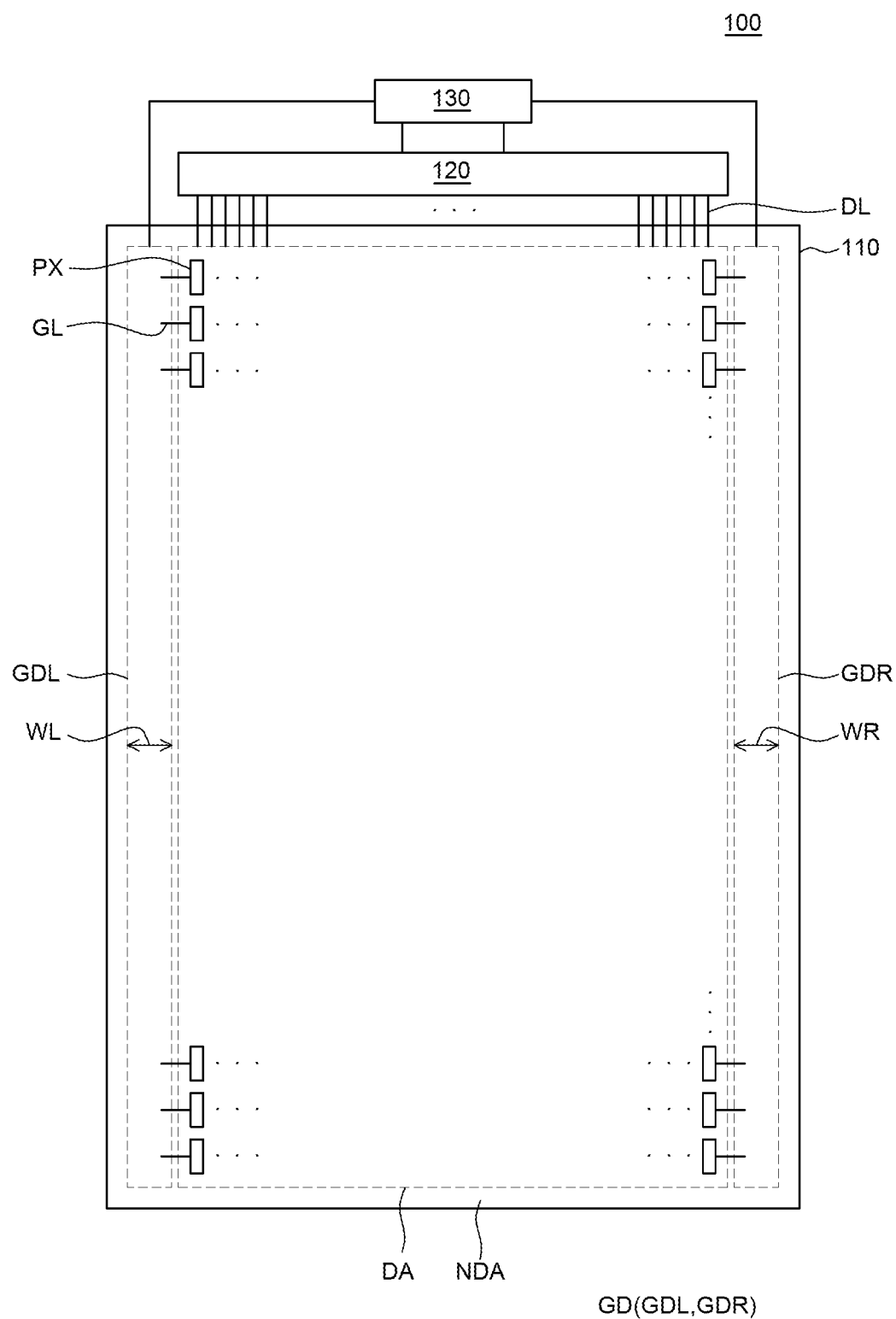
FIG. 1 is a block diagram of an electroluminescent display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, embodiments of the present disclosure will be described in detail with reference to the accompanying drawings.

FIG. 1 is a block diagram of an electroluminescent display device 100 according to an embodiment of the present disclosure.

Referring to FIG. 1, in the electroluminescent display device 100 according to an embodiment of the present disclosure, a plurality of data lines DL and a plurality of gate lines GL are disposed, and the electroluminescent display device 100 according to an embodiment of the present disclosure may include a display panel 110 in which a plurality of sub-pixels PX connected to the plurality of data lines DL and the plurality of gate lines GL are disposed, and a driving circuit providing driving signals to the display panel 110.

Although it is illustrated that the sub-pixels PX are disposed in a matrix form to form a pixel array, the present disclosure is not limited thereto and may be disposed in various forms.

The driving circuit may include a data driving circuit 120 that provides data signals to the plurality of data lines DL, a gate driving circuit GD that provides gate signals to the plurality of gate lines GL, and a controller 130 that controls the data driving circuit 120 and the gate driving circuit GD.

The display panel 110 may include a display area DA where an image is displayed and a non-display area NDA that is an outer area of the display area DA. The plurality of sub-pixels PX may be disposed in the display area DA. The data lines DL providing data signals to the plurality of sub-pixels PX and the gate lines GL providing gate signals may be disposed in the plurality of sub-pixels PX.

The plurality of data lines DL disposed in the display area DA may extend to the non-display area NDA and may be electrically connected to the data driving circuit 120. The data line DL electrically connects the sub-pixels PX and the data driving circuit 120 and may be implemented as a single line, or may be implemented by connecting a plurality of lines through a contact hole using a link line.

The plurality of gate lines GL disposed in the display area DA may extend to the non-display area NDA and may be electrically connected to the gate driving circuit GD. The gate line GL electrically connects the sub-pixel PX and the gate driving circuit GD. Additionally, gate driving-related lines that are necessary for the gate driving circuit GD to generate or drive gate signals may be disposed in the non-display area NDA. For example, the gate driving-related lines may include one or more high level gate voltage lines supplying a high level gate voltage to the gate driving circuit GD, one or more low level gate voltage lines supplying a low level gate voltage to gate driving circuits GD, a plurality of clock lines supplying a plurality of clock signals to the gate driving circuit GD, one or more start lines supplying one or more start signals to the gate driving circuit GD, and the like.

In the display panel 110, the plurality of data lines DL and the plurality of gate lines GL are disposed in the sub-pixels PX. For example, each of the plurality of data lines DL and the plurality of gate lines GL may be disposed in rows or columns. For convenience of explanation, it is assumed that the plurality of data lines DL are disposed in columns, and the plurality of gate lines GL are disposed in rows.

The controller 130 starts a scan according to a timing that is implemented in each frame, converts input image data input from the outside to match a data signal format used by the data driving circuit 120 and outputs a converted image data, and controls data driving at an appropriate time according to the scan.

The controller 130 receives, from the outside, timing signals including a vertical synchronization signal, a horizontal synchronization signal, an input data enable signal, and a clock signal together with the input image data. The controller 130 that has received the timing signals generates and outputs control signals for controlling the data driving circuit 120 and the gate driving circuit GD.

For example, the controller 130 outputs various data control signals including a source start pulse, a source sampling clock, a source output enable signal and the like to control the data driving circuit 120. The source start pulse controls a data sampling start timing of one or more data signal generating circuits constituting the data driving circuit 120. The source sampling clock is a clock signal that controls a sampling timing of data in each of the data signal generating circuits. The source output enable signal controls an output timing of the data driving circuit 120.

In addition, the controller 130 outputs gate control signals including a gate start pulse, a gate shift clock, a gate output enable signal and the like to control the gate driving circuit GD. The gate start pulse controls an operation start timing of one or more gate signal generating circuits constituting the gate driving circuit GD. The gate shift clock is a clock signal input to one or more gate signal generating circuits in common and controls a shift timing of a scan signal (or gate pulse). The gate output enable signal specifies timing information of the one or more gate signal generating circuits.

The controller 130 may be a timing controller used in a typical display device technology or may be a control device capable of further performing other control functions by including the timing controller.

The controller 130 may be implemented as a component separate from the data driving circuit 120, or may be implemented as a single integrated circuit by being integrated with the data driving circuit 120.

The data driving circuit 120 may be implemented by including one or more data signal generating circuits. The data signal generating circuit may include a shift register, a latch circuit, a digital-to-analog converter, an output buffer, and the like. The data signal generating circuit may further include an analog-to-digital converter in some cases.

The data signal generating circuit may be connected to a bonding pad of the display panel 110 in a tape automated bonding (TAB) method, a chip on glass (COG) method, or a chip on panel (COP) method, may be directly disposed on the display panel 110, or may be integrated and disposed on the display panel 110. In addition, a plurality of the data signal generating circuits may be implemented in a chip on film (COF) method in which they are mounted on a source-circuit film connected to the display panel 110.

The gate driving circuit GD sequentially supplies scan signals to the plurality of gate lines GL to thereby drive the sub-pixels PX connected to the plurality of gate lines GL. The gate driving circuit GD may include a shift register, a level shifter, and the like.

The gate driving circuit GD may be connected to a bonding pad of the display panel 110 in a tape automated bonding (TAB) method, a chip on glass (COG) method, or a chip on panel (COP) method, or may be implemented as a GIP type and disposed to be integrated in the display panel 110. In addition, a plurality of the gate signal generating circuits may be implemented in a chip on film (COF) method in which they are mounted on a gate-circuit film connected to the display panel 110. Hereinafter, for convenience of explanation, a case in which the gate driving circuit GD includes a plurality of gate signal generating circuits, and the plurality of gate signal generating circuits are implemented in a GIP type and disposed in the non-display area NDA of the display panel 110 is illustrated as an example.

The gate driving circuit GD sequentially supplies scan signals of a transistor turn-on voltage or a transistor turn-off voltage to the plurality of gate lines GL according to the control of the controller 130. When a specific gate line is opened by the gate driving circuit GD, the data driving circuit 120 converts image data received from the controller 130 into a data signal in an analog format and supplies it to the plurality of data lines DL.

The data driving circuit 120 may be located on one side of the display panel 110. For example, it may be on an upper side, a lower side, a left side, or a right side of the display panel 110. Also, the data driving circuit 120 may be located on both sides of the display panel 110 according to a driving method, a panel design method, and the like. For example, it may be on upper and lower sides, or left and right sides of the display panel 110.

The gate driving circuit GD may be located on one side of the display panel 110. For example, it may be on the upper side, the lower side, the left side, or the right side of the display panel 110. Also, the data driving circuit 120 may be located on both sides of the display panel 110 according to a driving method, a panel design method, and the like. For example, it may be on the upper and lower sides of the display panel 110, or the left and right sides of the display panel 110.

Hereinafter, a case in which the data driving circuit 120 is positioned on the upper side of the display panel 110 and the gate driving circuit GD is positioned on both the left side and the right side of the display panel 110 is described as an example. In this case, in the display panel 110, the gate driving circuit GD includes a first gate driving circuit GDL located on the left side of the display panel 110 and a second gate driving circuit GDR located on the right side of the display panel 110. A width of an area occupied by the first gate driving circuit GDL may be referred to as a first width WL, and a width of an area occupied by the second gate driving circuit GDR may be referred to as a second width WR. A size of a bezel of the electroluminescent display device 100 may vary according to the respective widths WL and WR of the first gate driving circuit GDL and the second gate driving circuit GDR. Since an aesthetic effect of the electroluminescent display device 100 increases as the bezel is smaller, it is beneficial to simplify the gate driving circuit GD in order to reduce the bezel.

The plurality of gate lines GL disposed on the display panel 110 may include a plurality of scan lines, a plurality of emission signal lines, and the like. The plurality of scan lines and the plurality of emission signal lines are lines that transmit different types of gate signals to respective gate nodes of different transistors.

Accordingly, the gate driving circuit GD includes a plurality of scan driving circuits for outputting scan signals to the plurality of scan lines that are one type of the gate lines GL, and a plurality of emission driving circuits for outputting emission signals to the plurality of emission signal lines that are another type of the gate lines GL.

Figure 2A:
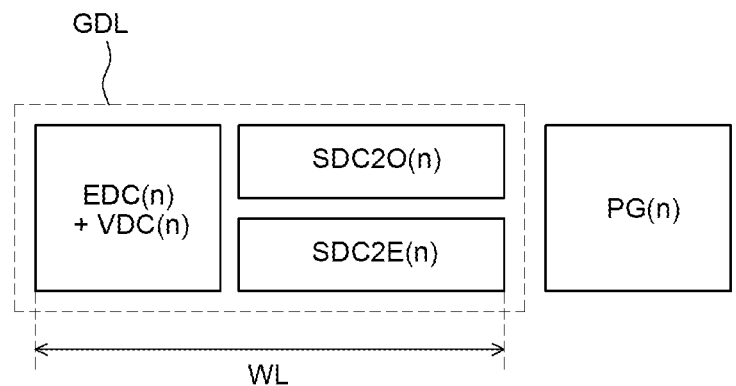
FIG. 2A is a block diagram illustrating a gate driving circuit disposed on a left side of the electroluminescent display device according to an embodiment of the present disclosure.
Figure 2B:
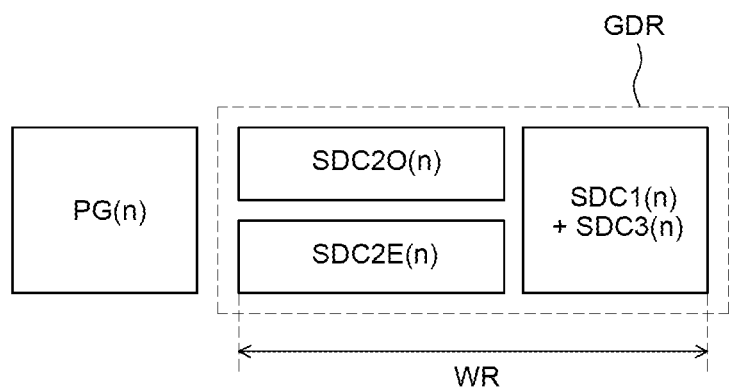
FIG. 2B is a block diagram illustrating a gate driving circuit disposed on a right side of the electroluminescent display device according to an embodiment of the present disclosure.

FIG. 2A is a block diagram illustrating the first gate driving circuit GDL disposed on the left side of the electroluminescent display device 100 according to an embodiment of the present disclosure. FIG. 2B is a block diagram illustrating the second gate driving circuit GDR disposed on the right side of the electroluminescent display device 100 according to an embodiment of the present disclosure.

The display area DA includes the plurality of sub-pixels PX, and displays an image based on a gray level displayed by each of the sub-pixels PX. The respective sub-pixels PX are connected to the data lines DL disposed along a column line and connected to the gate lines GL disposed along a pixel line. In this case, the sub-pixels PX located on the same row line are referred to as a pixel line PG, and the sub-pixels PX located on the same pixel line share the same gate line GL and simultaneously receive a gate signal. Accordingly, the sub-pixels PX connected to a first gate line may be referred to as a first pixel line, and the sub-pixels PX connected to an n-th gate line may be referred to as an n-th pixel line PG(n). When the number of pixel lines disposed in the display area DA is n, the first pixel line to the n-th pixel line are sequentially driven in synchronization with the gate signal generating circuits. In this case, the gate driving circuit GD is composed of gate signal generating circuits corresponding to the number of the pixel lines.

As mentioned above, the display panel 110 includes the display area DA where an image is displayed based on the sub-pixels PX and the non-display area NDA where signal lines, drivers and the like are located and an image is not displayed.

The sub-pixel PX includes an emission element and a pixel circuit for controlling the amount of current applied to an anode of the emission element. The pixel circuit may include a driving transistor for controlling the amount of current so that a predetermined current can flow through the emission element. The emission element emits light in an emission period, and does not emit light in periods other than the emission period. In the periods other than the emission period, the pixel circuit may be initialized, the scan signal may be input to the pixel circuit, and programming and pixel circuit compensation periods may be conducted. For example, the pixel circuit compensation may be a threshold voltage compensation of the driving transistor. In the periods other than the emission period, the emission element should not emit light because a current capable of emitting light with a specific luminance is not constantly supplied. For example, in a method for making the emission element not emit light, an emission control transistor may be connected between the anode of the emission element and the driving transistor. The emission control transistor is connected to the emission signal line and is controlled by the emission signal output from the emission signal generating circuit. In the emission period, the emission signal may be a turn-on voltage, and in the periods other than the emission period, the emission signal may be a turn-off voltage.

The gate signals for driving the sub-pixels PX included in the display panel 110 include scan signals and emission signals. Accordingly, the gate driving circuit GD may separately include the scan driving circuits that provide the scan signals and the emission driving circuits that apply the emission signals. The scan signals are applied to the pixel lines PG through the scan lines, and the emission signals are applied to the pixel lines PG through the emission signal lines.

As described above, to apply on bias stress so as to alleviate hysteresis of the driving transistor of the electroluminescent display device 100, an initialization signal may be raised from a low level to a high level in one frame. Accordingly, in some embodiments, the gate driving circuit GD may include a separate gate signal generating circuit for swinging the initialization signal. In this case, the gate driving circuit GD includes a separate gate signal generating circuit that swings the initialization signal in order to apply on bias stress to the pixel circuit, so that the gate driving circuit GD is complicated and the bezel of the electroluminescent display device 100 may increase.

However, in the electroluminescent display device 100 according to an embodiment of the present disclosure, the bezel may be reduced by simplifying the separate gate signal generating circuit.

Accordingly, as shown in FIGS. 2A and 2B, the first gate driving circuit GDL that provides the gate signal to the n-th pixel line PG(n) and is disposed on the left side of the display area DA may include an odd-numbered second scan signal generating circuit SDC2O(n), an even-numbered second scan signal generating circuit SDC2E(n), and an emission signal generating circuit EDC(n).

The second gate driving circuit GDR that provides the gate signal to the n-th pixel line PG(n) and is disposed on the right side of the display area DA may include an odd-numbered second scan signal generating circuit SDC2O(n), an even-numbered second scan signal generating circuit SDC2E(n), and a first scan signal generating circuit SDC1(n).

An initialization signal generating circuit VDC(n) for swinging the initialization signal that is provided to the pixel circuit is implemented using an output signal of the emission signal generating circuit EDC(n), so that the first gate driving circuit GDL may be simplified. In this case, the first width WL of the first gate driving circuit GDL may be reduced by several tens of μm.

A third scan signal as well as a first scan signal are provided to the pixel circuit to be described with reference to FIG. 3. A third scan signal generating circuit SDC3(n) is implemented using an output signal of the first scan signal generating circuit SDC1(n), so that the second gate driving circuit GDR may be simplified. In this case, the second width WR of the second gate driving circuit GDR may be reduced by several tens of μm.

Figure 3:
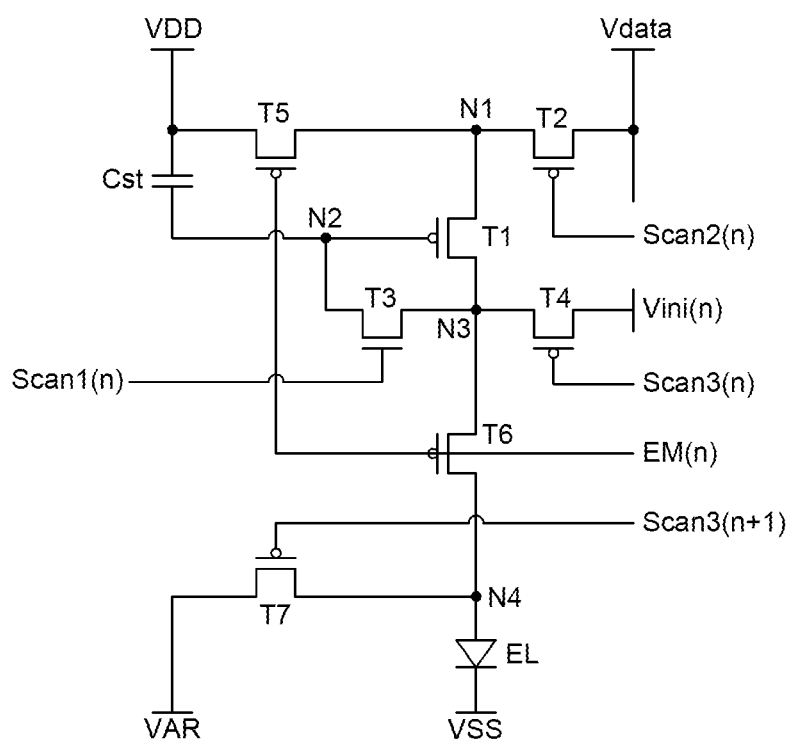
FIG. 3 is a circuit diagram illustrating a pixel circuit of the electroluminescent display device according to an embodiment of the present disclosure.
Figure 4:
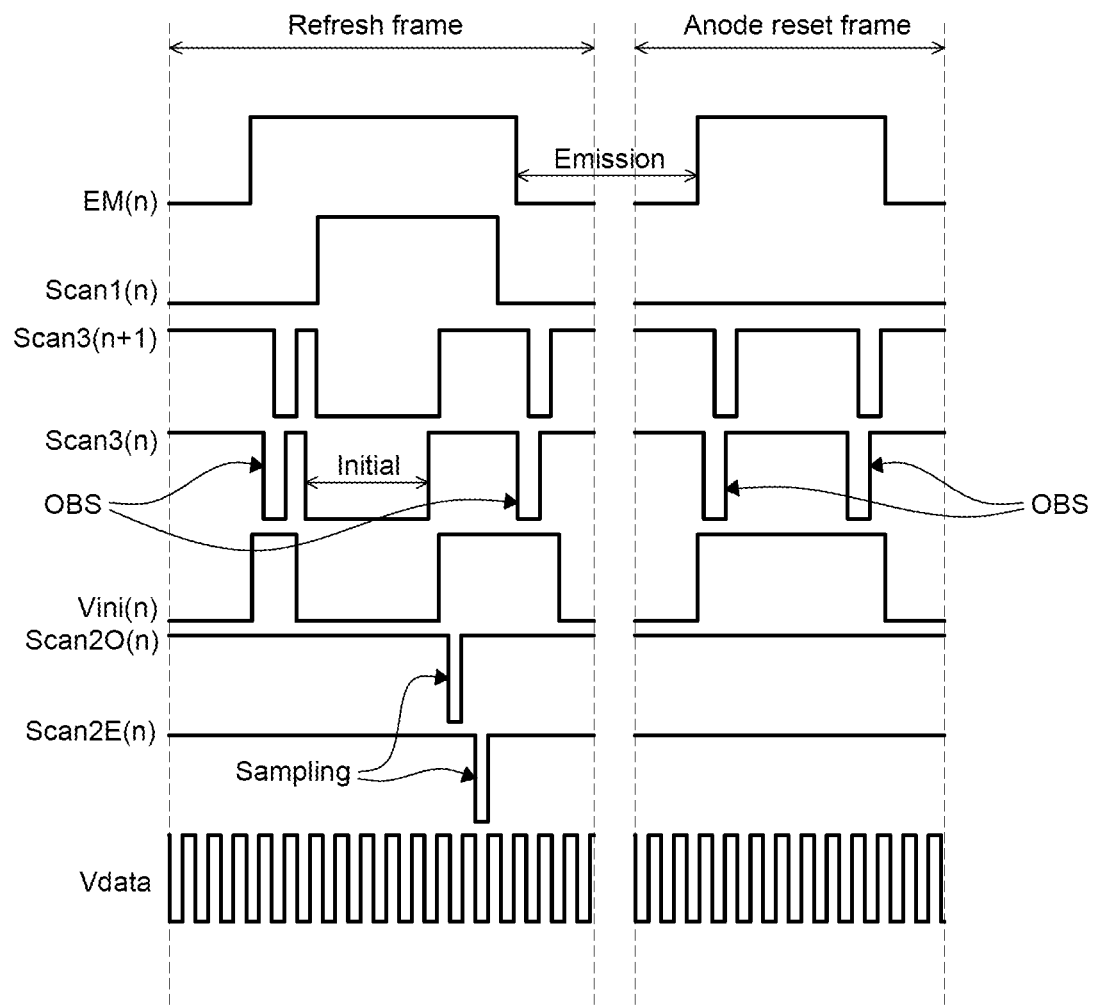
FIG. 4 is a waveform diagram of signals provided to the pixel circuit of FIG. 3.

Accordingly, since the respective widths of the first gate driving circuit GDL and the second gate driving circuit GDR are reduced by several tens of μm, the widths of the bezel of the electroluminescent display device 100 may be reduced by several tens to several hundreds of FIG. 3 is a circuit diagram illustrating a pixel circuit of the electroluminescent display device 100 according to an embodiment of the present disclosure. FIG. 4 is a waveform diagram of signals provided to the pixel circuit of FIG. 3. The pixel circuit shown in FIG. 3 is described with the sub-pixels PX disposed on the n-th pixel line PG(n) as an example.

Each of the sub-pixels PX includes an emission element EL and a pixel circuit, and the pixel circuit includes a driving transistor T1, second to seventh transistors T2 to T7, and a storage capacitor Cst.

The emission element EL emits light by a driving current supplied from the driving transistor T1. A multilayered organic compound layer is formed between an anode electrode and a cathode electrode of the emission element EL. The organic compound layer may include at least one hole transfer layer and an electron transfer layer, and an emission layer. Here, the hole transfer layer is a layer that injects or transports holes to the emission layer, and may be, for example, a hole injection layer, a hole transfer layer, and an electron blocking layer. In addition, the electron transfer layer is a layer that injects or transfers electrons to the emission layer, and may be, for example, an electron transport layer, an electron injection layer, and a hole blocking layer. The anode electrode of the emission element EL is connected to a fourth node N4, and the cathode electrode of the emission element EL is connected to a line to which a low potential driving voltage VSS is provided.

The driving transistor T1 controls a driving current applied to the emission element EL according to a source-gate voltage Vsg. The driving transistor T1 may be a p-type MOSFET (PMOS) and may be implemented as a low-temperature polycrystalline silicon (LTPS) thin film transistor. In addition, a source electrode of the driving transistor T1 is connected to a first node N1, a gate electrode of the driving transistor T1 is connected to a second node N2, and a drain electrode of the driving transistor T1 is connected to a third node N3. The driving transistor T1 may be referred to as a first transistor.

The second transistor T2 applies a data voltage Vdata supplied from the data line to the first node N1 that is the source electrode of the driving transistor T1. The second transistor T2 may be a p-type MOSFET (PMOS) and may be implemented as a low-temperature polycrystalline silicon (LTPS) thin film transistor. The second transistor T2 includes a source electrode connected to the data line, a drain electrode connected to the first node N1, and a gate electrode connected to a second scan signal line that transmits a second scan signal Scan2(n). Accordingly, the second transistor T2 applies the data voltage Vdata supplied from the data line, to the first node N1 that is the source electrode of the driving transistor T1, in response to the second scan signal Scan2(n) at a low level which is a turn-on voltage.

A third transistor T3 diode-connects the gate electrode and the drain electrode of the driving transistor T1. The third transistor T3 may be an n-type MOSFET (NMOS) and may be implemented as an oxide thin film transistor in order to reduce or minimize a leakage current during a turn-off period. The third transistor T3 includes a drain electrode or source electrode connected to the third node N3, a source electrode or drain electrode connected to the second node N2, and a gate electrode connected to a first scan signal line that transmits a first scan signal Scan1(n). Accordingly, the third transistor T3 diode-connects the gate electrode and the drain electrode of the driving transistor T1 in response to the first scan signal Scan1(n) of a high level which is a turn-on voltage.

A fourth transistor T4 applies an initialization signal Vini(n) to the third node N3 that is the drain electrode of the driving transistor T1. The fourth transistor T4 may be a p-type MOSFET (PMOS) and may be implemented as a low-temperature polycrystalline silicon (LTPS) thin film transistor. The fourth transistor T4 includes a source electrode connected to an initialization signal line that transmits the initialization signal Vini(n), a drain electrode connected to the third node N3, and a gate electrode connected to a third scan signal line that transmits a third scan signal Scan3(n). Accordingly, the fourth transistor T4 applies the initialization signal Vini(n) to the third node N3 that is the drain electrode of the driving transistor T1 in response to the third scan signal Scan3(n) of a low level which is a turn-on voltage.

A fifth transistor T5 applies a high potential driving voltage VDD to the first node N1 that is the source electrode of the driving transistor T1. The fifth transistor T5 may be a p-type MOSFET (PMOS) and may be implemented as a low-temperature polycrystalline silicon (LTPS) thin film transistor. The fifth transistor T5 includes a source electrode connected to a high potential driving voltage line that transmits the high potential driving voltage VDD, a drain electrode connected to the first node N1, and a gate electrode connected to the emission signal line that transmits an emission signal EM(n). Accordingly, the fifth transistor T5 applies the high potential driving voltage VDD to the first node N1 that is the source electrode of the driving transistor T1 in response to the emission signal EM(n) of a low level, which is the turn-on voltage.

A sixth transistor T6 forms a current path between the driving transistor T1 and the emission element EL. The sixth transistor T6 may be a p-type MOSFET (PMOS) and may be implemented as a low-temperature polycrystalline silicon (LTPS) thin film transistor. The sixth transistor T6 includes a source electrode connected to the third node N3, a drain electrode connected to the fourth node N4, and a gate electrode connected to the emission signal line that transmits the emission signal EM(n). The sixth transistor T6 forms a current path between the third node N3 that is the source electrode of the sixth transistor T6 and the fourth node N4 that is the drain electrode of the sixth transistor T6 in response to the emission signal EM(n). Accordingly, the sixth transistor T6 forms a current path between the driving transistor T1 and the emission element EL in response to the emission signal EM(n) of a low level which is a turn-on voltage.

The seventh transistor T7 applies a reset voltage VAR to the fourth node N4 that is the anode electrode of the emission element EL. The seventh transistor T7 may be a p-type MOSFET (PMOS) and may be implemented as a low-temperature polycrystalline silicon (LTPS) thin film transistor. The seventh transistor T7 includes a source electrode connected to a reset voltage line that transmits the reset voltage VAR, a drain electrode connected to the fourth node N4, and a gate electrode connected to the third scan signal line that transmits the third scan signal Scan3(n). Accordingly, the seventh transistor T7 applies the reset voltage VAR to the fourth node N4 that is the anode electrode of the emission element EL, in response to a third scan signal Scan3(n+1) which is provided to an (n+1)-th pixel line while having a low level that is a turn-on level.

The storage capacitor Cst maintains the data voltage Vdata stored in each of the sub-pixels PX during one frame. The storage capacitor Cst includes a first electrode connected to the second node N2 and a second electrode connected to the high potential driving voltage line that transmits the high potential driving voltage VDD. That is, one electrode of the storage capacitor Cst is connected to the gate electrode of the driving transistor T1, and the other electrode of the storage capacitor Cst is connected to the high potential driving voltage line that transmits the high potential driving voltage VDD.

Referring to FIGS. 3 and 4, driving of the sub-pixel PX of the electroluminescent display device 100 according to an embodiment of the present disclosure will be described as follows.

The electroluminescent display device 100 may be dividedly driven in a refresh frame and an anode reset frame. In the refresh frame, the data voltage Vdata is programmed in each sub-pixel PX, and the emission element EL emits light. The anode reset frame may be a vertical blank frame, and the anode electrode of the emission element EL is reset during the anode reset frame.

In the electroluminescent display device 100 according to an embodiment of the present disclosure, the refresh frame and the anode reset frame may include a plurality of on bias stress periods (OBS, hereinafter referred to as "stress periods"). The stress period OBS is a period in which bias stress is applied to the third node N3 that is the drain electrode of the driving transistor T1. As shown in FIG. 4, during the stress periods OBS of the refresh frame and the anode reset frame, the initialization signal Vini(n) is at a high level, and the third scan signal Scan3(n) is at a low level which is a turn-on voltage.

In the electroluminescent display device 100 according to the embodiment of the present disclosure, the refresh frame may be divided into an initial period Initial, a sampling period Sampling, and an emission period Emission. The initial period Initial is a period in which a voltage of the third node N3 that is the drain electrode of the driving transistor T1 is initialized. The sampling period Sampling is a period in which a threshold voltage Vth of the driving transistor T1 is sampled and the data voltage Vdata is programmed. The emission period Emission is a period in which the emission element EL emits light according to a driving current due to the programmed source-gate voltage Vsg of the driving transistor T1. And, as shown in FIG. 4, the initialization signal Vini(n) is at a low level during the initial period of the refresh frame, and the third scan signal Scan3(n) is also at a low level which is a turn-on voltage. In addition, during the sampling period, the initialization signal Vini(n) is at a high level, and the third scan signal Scan3(n) is at a high level which is a turn-off voltage. During the emission period, the initialization signal Vini(n) is at a low level, and the third scan signal Scan3(n) is at a high level which is a turn-off voltage.

Specifically, referring to FIGS. 3 and 4, during the stress periods OBS of the refresh frame and the anode reset frame, the third scan signal Scan3(n) is at a low level which is a turn-on voltage. In the refresh frame and the anode reset frame including the plurality of stress periods OBS, the third scan signal Scan3(n) may be a waveform including a plurality of pulses. In addition, in the plurality of stress periods OBS, bias stress of the driving transistor T1 may be reduced by switching the initialization signal Vini(n) from a low level to a high level and providing it to the third node N3 that is the drain node of the driving transistor T1. The initialization signal Vini(n) at a high level may be selected within a range of voltage that is sufficiently higher than an operating voltage of the emission element EL, and may be set to a voltage equal to or lower than the high potential driving voltage VDD. That is, the on bias stress may be applied to the third node N3 that is the drain electrode of the driving transistor T1 during the stress period OBS to thereby decrease the source-drain voltage Vsd of the driving transistor T1. Accordingly, during the stress period OBS, an influence of hysteresis may be reduced by alleviating charge characteristics of a channel portion of the driving transistor T1 to the same voltage. In this case, the same voltage is a voltage applied to the drain electrode of the driving transistor T1 during the stress period OBS.

In the electroluminescent display device 100 according to an embodiment of the present disclosure, the anode reset frame may include an anode reset period. In the anode reset period, the seventh transistor T7 is turned on by an (n+1)-th third scan signal Scan3(n+1) and applies the reset voltage VAR to the fourth node N4. That is, the anode electrode of the emission element EL is reset to the reset voltage VAR. In this case, the reset voltage VAR is a voltage equal to or lower than the low potential driving voltage VSS and may maintain the same emission characteristics of the emission element EL in the refresh frame and the anode reset frame and prevent screen flicker. The anode reset period may also be included in the refresh frame.

In addition, in the anode reset frame, the initialization signal Vini(n) may be at a high level. The third scan signal Scan3(n) at a high level is applied to the gate electrode of the fourth transistor T4 and the initialization signal Vini(n) at a high level is applied to the source electrode of the fourth transistor T4, so that a potential difference between the gate electrode and the source electrode of the fourth transistor T4 may be reduced. Accordingly, a leakage current of the fourth transistor T4 during the anode reset frame may be reduced or minimized.

During the initial period Initial of the refresh frame in the electroluminescent display device 100 according to the embodiment of the present disclosure, the first scan signal Scan1(n) is at a high level which is a turn-on voltage, and the third scan signal Scan3(n) is at a low level which is a turn-on voltage. Accordingly, the third transistor T3 and the fourth transistor T4 are turned on and apply the initialization signal Vini(n) to the third node N3 and the second node N2. As a result, the gate electrode and the drain electrode of the driving transistor T1 are initialized with the initialization signal Vini(n). In the initial period Initial of the refresh frame, the initialization signal Vini(n) at a low level may be selected within a range of voltage which is sufficiently lower than the operating voltage of the emission element EL, and may be set to a voltage equal to or lower than the low potential driving voltage VSS.

Subsequently, during the sampling period Sampling of the refresh frame, the first scan signal Scan1(n) is at a high level which is a turn-on voltage, and the second scan signal Scan2(n) is at a low level which is a turn-on voltage. During the sampling period Sampling of the refresh frame, the first scan signal Scan1(n) is at a high level which is a turn-on voltage, and an odd-numbered second scan signal Scan2O(n) is at a low level which is a turn-on voltage, and an even-numbered second scan signal Scan2E(n) is at a low level which is a turn-on voltage.

Accordingly, during the sampling period Sampling, the second transistor T2 is turned on, and the data voltage Vdata is applied to the first node N1. In addition, as the third transistor T3 is also turned on, the driving transistor T1 is diode-connected and the gate electrode and the drain electrode of the driving transistor T1 are short-circuited so that the driving transistor T1 operates like a diode. In the sampling period Sampling, the driving transistor T1 is turned on and a current Ids flows between a source and a drain thereof. Since the gate electrode and the drain electrode of the driving transistor T1 are in a state of diode-connection, a voltage of the second node N2 rises until a gate-source voltage Vgs of the driving transistor T1 becomes the threshold voltage Vth, by the current flowing from the source electrode to the drain electrode. During the sampling period Sampling, the voltage of the second node N2 is charged with a voltage Vdata−|Vth| corresponding to a difference between the data voltage Vdata and the threshold voltage Vth of the driving transistor T1.

Subsequently, during the emission period Emission of the refresh frame, the emission signal EM(n) is at a low level which is a turn-on voltage. Accordingly, the fifth transistor T5 is turned on and applies the high potential driving voltage VDD to the first node N1. In addition, the sixth transistor T6 is also turned on to form a current path between the third node N3 and the fourth node N4. As a result, a driving current Ioled generated through the source electrode and the drain electrode of the driving transistor T1 is applied to the emission element EL. During the emission period Emission, a relational expression for the driving current Ioled that flows through the emission element EL is as below [Equation 1].

$$\text{Ioled}=k/2(Vgs+|Vth|)^2=k/2(V\text{data}-VDD)^2 \qquad \text{Equation 1}$$

In [Equation 1], k/2 represents a proportional constant determined by electron mobility, parasitic capacitance, and channel capacitance of the driving transistor T1.

As shown in [Equation 1], a threshold voltage Vth component of the driving transistor T1 is erased in the relational expression of the driving current Ioled. This means that in the display device according to the present disclosure, the driving current Ioled does not change even if the threshold voltage Vth changes. As described above, the display device according to the present disclosure can program the data voltage regardless of the amount of change in the threshold voltage Vth during the sampling period.

As described above, the anode electrode of the emission element EL is reset to the reset voltage VAR in both the anode reset frame and the refresh frame.

As a result, the anode electrode of the emission element EL may be periodically reset over the refresh frame and the anode reset frame in the electroluminescent display device 100 according to the embodiment of the present disclosure. Accordingly, a continuous increase in voltage of the anode electrode of the emission element EL due to a leakage current is prevented even in driving at a low frequency, so that the anode electrode of the emission element EL can maintain a constant voltage level. Accordingly, even though a driving frequency is switched to a low frequency, a change in luminance of the electroluminescent display device 100 is reduced or minimized, so that image quality can be improved.

Figure 5:
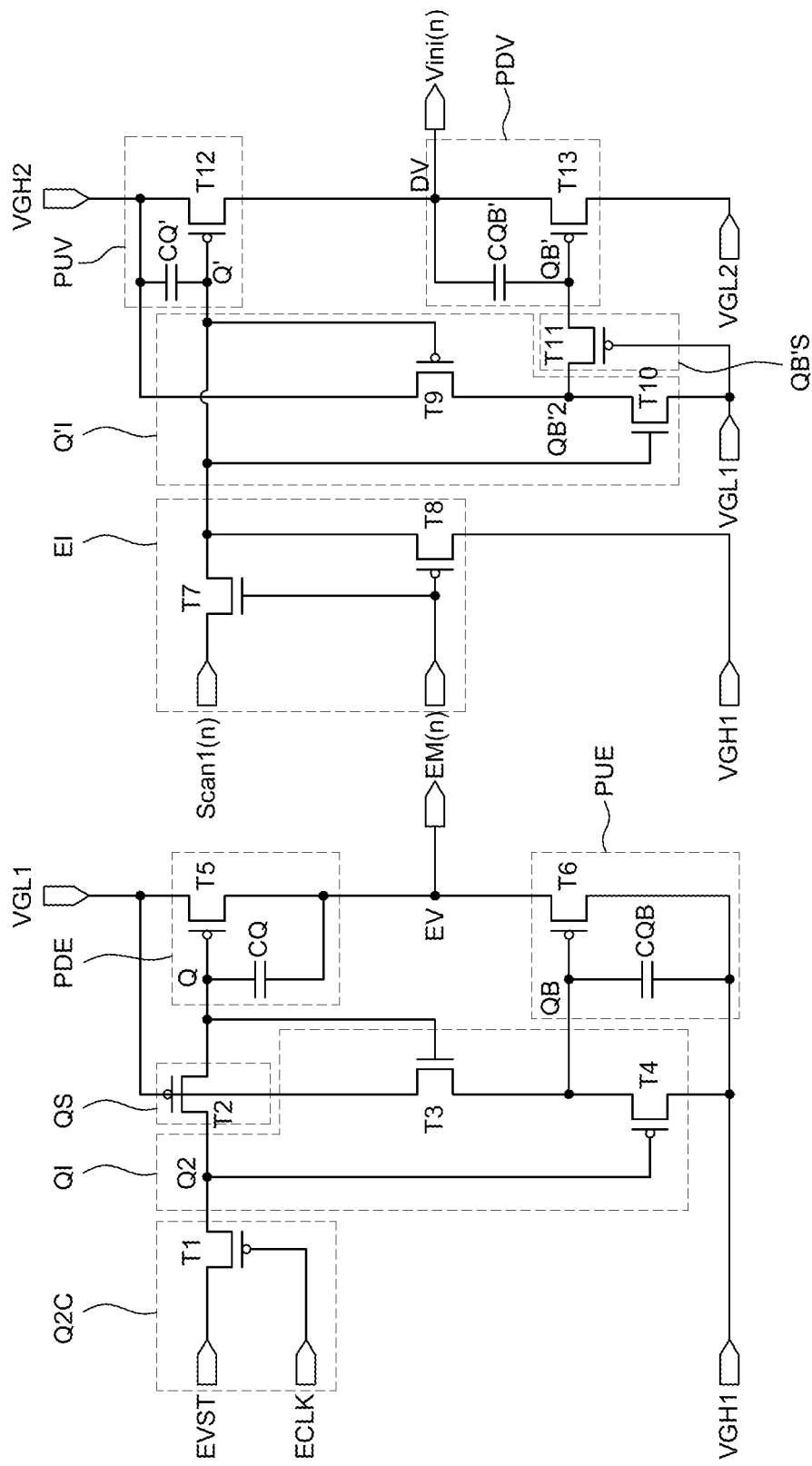
FIG. 5 is a circuit diagram illustrating a gate driving circuit of the electroluminescent display device according to an embodiment of the present disclosure.

FIG. 5 is a circuit diagram illustrating a gate driving circuit of the electroluminescent display device 100 according to an embodiment of the present disclosure.

In order to apply on bias stress to the driving transistor of the electroluminescent display device 100 and to raise the initialization signal from a low level to a high level even in one frame, the electroluminescent display device 100 may include the gate driving circuit GD composed of separate gate signal generating circuits that swing the initialization signal. In this case, the widths of the gate driving circuit GD may increase due to additional circuits, but to prevent this, the emission signal generating circuit may be used.

Accordingly, hereinafter, the emission signal generating circuit EDC(n) that provides the emission signal EM(n) and the initialization signal generating circuit VDC(n) that provides the initialization signal Vini(n) using the emission signal generating circuit EDC(n) will be described below.

Referring to FIG. 5, the emission signal generating circuit EDC(n) includes a first pull-down unit PDE, a first pull-up unit PUE, a Q node maintenance unit QS, a Q2 node controller Q2C, and a Q node inverter QI.

The first pull-down unit PDE outputs the emission signal EM(n) as a turn-on voltage in response to a voltage of a Q node, and the first pull-up unit PUE outputs the emission signal EM(n) as a turn-off voltage in response to a voltage of the QB node. In addition, the emission signal EM(n) determined by the first pull-down unit PDE and the first pull-up unit PUE is applied to the n-th pixel line PG(n).

The Q node maintenance unit QS is connected between the Q node and a Q2 node and serves as a buffer preventing a sudden change in voltage applied to the Q node. The Q node maintenance unit QS continuously electrically connects the Q node and the Q2 node. Accordingly, a voltage of the Q2 node maintains the same state as the voltage of the Q node.

The Q2 node controller Q2C is a component for charging or discharging the Q2 node, and applies a turn-on voltage or a turn-off voltage to the Q2 node using a start signal EVST. When n is a natural number greater than or equal to 2, the Q2 node controller Q2C may use an output signal EM(n−1) of an (n−1)-th emission signal generating circuit EDC(n−1) as a start signal.

The Q node inverter QI applies a reversal voltage of the Q node to the QB node according to a Q2 node voltage that is applied by the Q2 node controller Q2C. Here, the reversal voltage of the Q node is a voltage having a phase opposite to that of the voltage of the Q node.

The initialization signal generating circuit VDC(n) includes a second pull-up unit PUV, a second pull-down unit PDV, a QB' node maintenance unit QB'S, an emission signal inverter EI, and a Q' node inverter Q'I.

The second pull-up unit PUV outputs the initialization signal Vini(n) as a high level voltage in response to a voltage of the Q' node, and the second pull-down unit PDV outputs the initialization signal Vini(n) as a low level voltage in response to a voltage of the QB' node. In addition, the initialization signal Vini(n) determined by the second pull-up unit PUV and the second pull-down unit PDV is applied to the n-th pixel line PG(n).

The QB' node maintenance unit QB'S is connected between a QB' node and a QB'2 node and serves as a buffer preventing a sudden change in voltage applied to the QB' node. The QB' node maintenance unit QB'S continuously electrically connects the QB' node and the QB'2 node. Accordingly, a voltage of the QB'2 node maintains the same state as the voltage of the QB' node.

The emission signal inverter EI applies the first scan signal Scan1(n) or a voltage having a phase opposite to that of the emission signal EM(n) to the Q' node according to the emission signal EM(n) output from the emission signal generating circuit EDC(n).

The Q' node inverter Q'I applies a reversal voltage of the Q' node to the QB'2 node according to the voltage of the Q' node that is applied by the emission signal inverter EI. Here, the reversal voltage of the Q' node is a voltage having a phase opposite to that of the voltage of the Q' node.

Meanwhile, the aforementioned turn-off voltage varies depending on a type of the transistor to which the turn-off voltage is applied. The turn-off voltage is at a high level for a p-type transistor and is at a low level for an n-type transistor. In addition, the turn-on voltage is at a low level for a p-type transistor and is at a high level for an n-type transistor. The gate signal generating circuit according to the embodiment of the present disclosure includes both an n-type transistor and a p-type transistor. The emission signal EM(n) and the initialization signal Vini(n), which are output signals of the gate signal generating circuit, are provided to the pixel circuit included in the n-th pixel line PG(n). A specific circuit structure and operation of the gate signal generating circuit will be described below.

Figure 6:
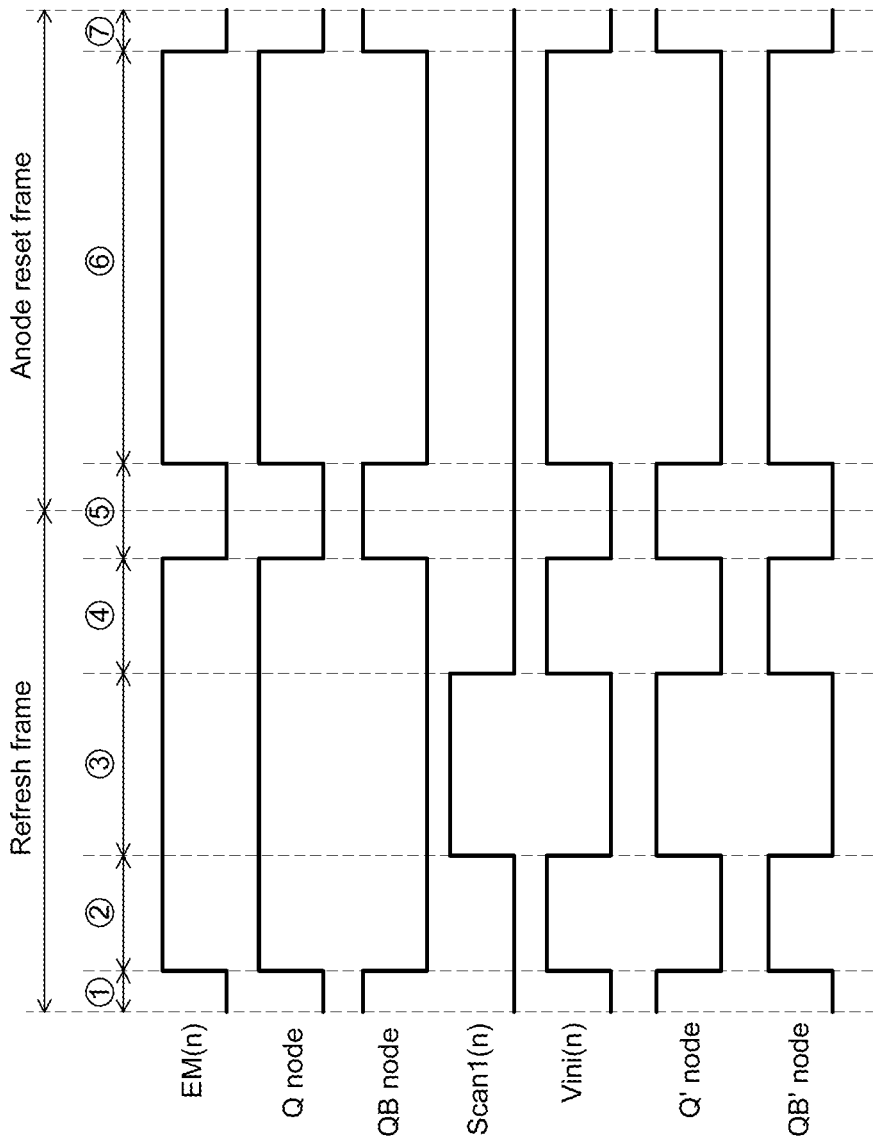
FIG. 6 is a waveform diagram of signals provided to the gate driving circuit of FIG. 5.
Figure 7A:
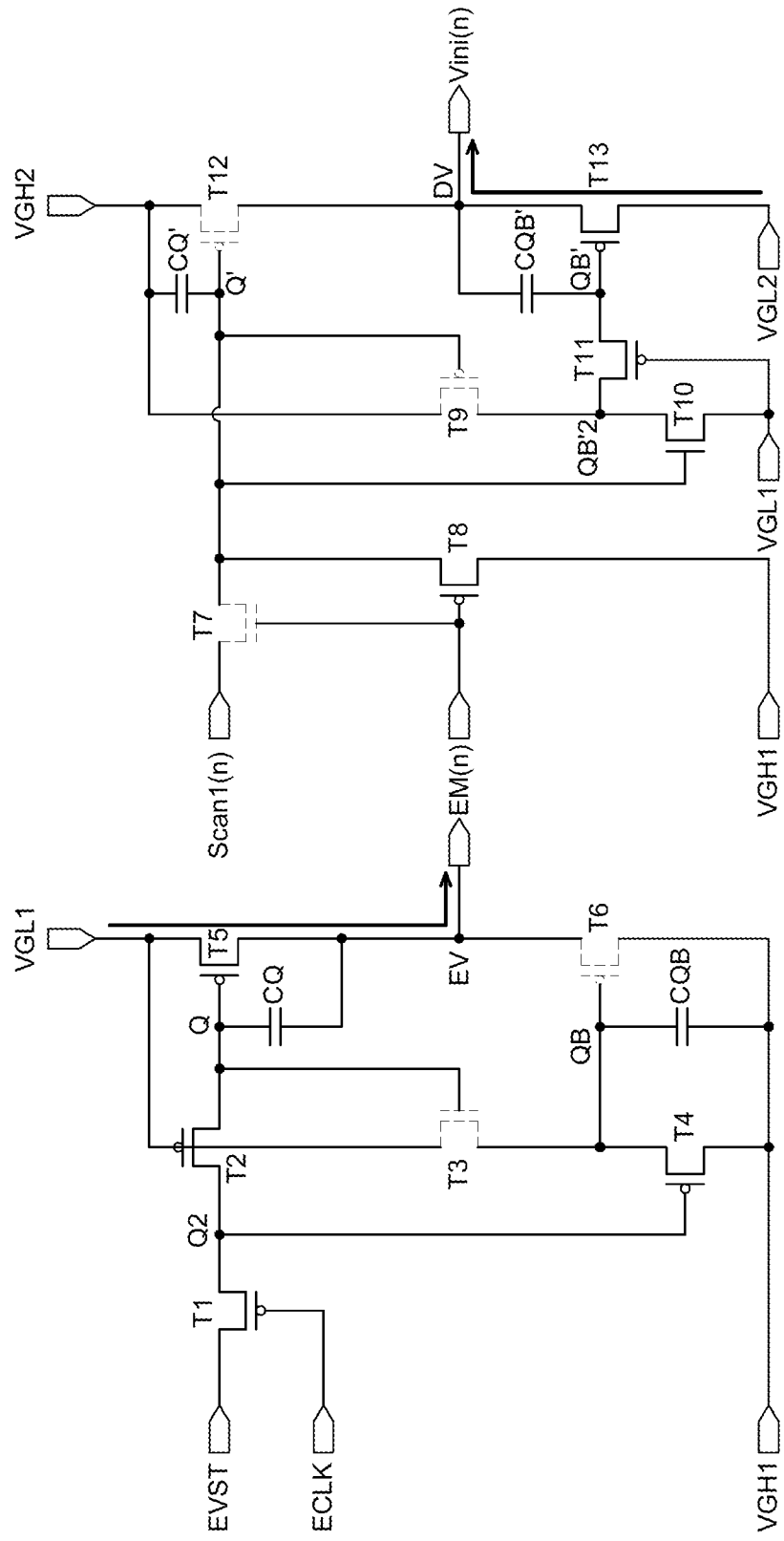
FIG. 7A is a circuit diagram of the gate driving circuit according to an embodiment of the present disclosure during periods ①, ⑤, and ⑦ of FIG. 6.
Figure 7B:
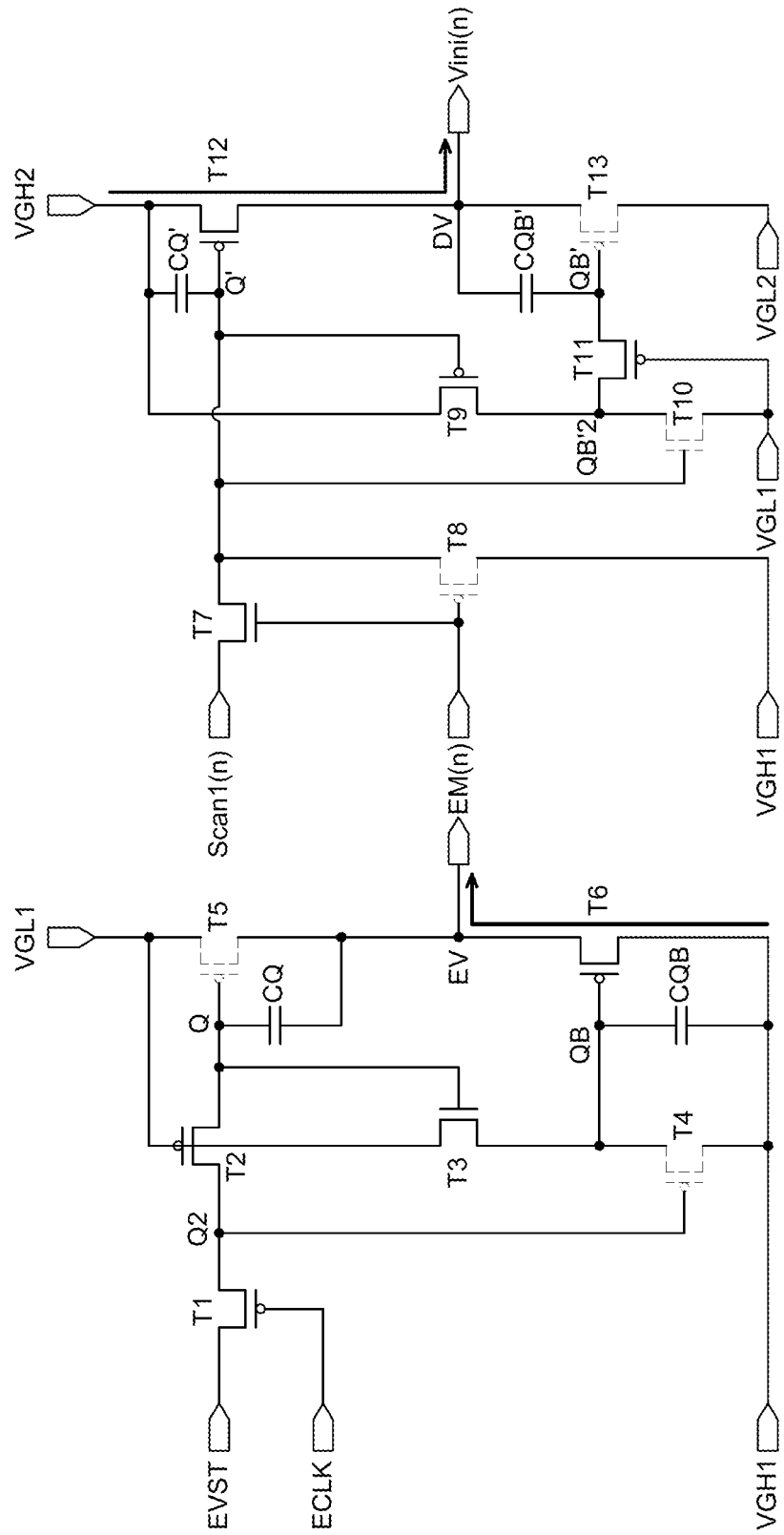
FIG. 7B is a circuit diagram of the gate driving circuit according to an embodiment of the present disclosure during periods ②, ④, and ⑥ of FIG. 6.
Figure 7C:
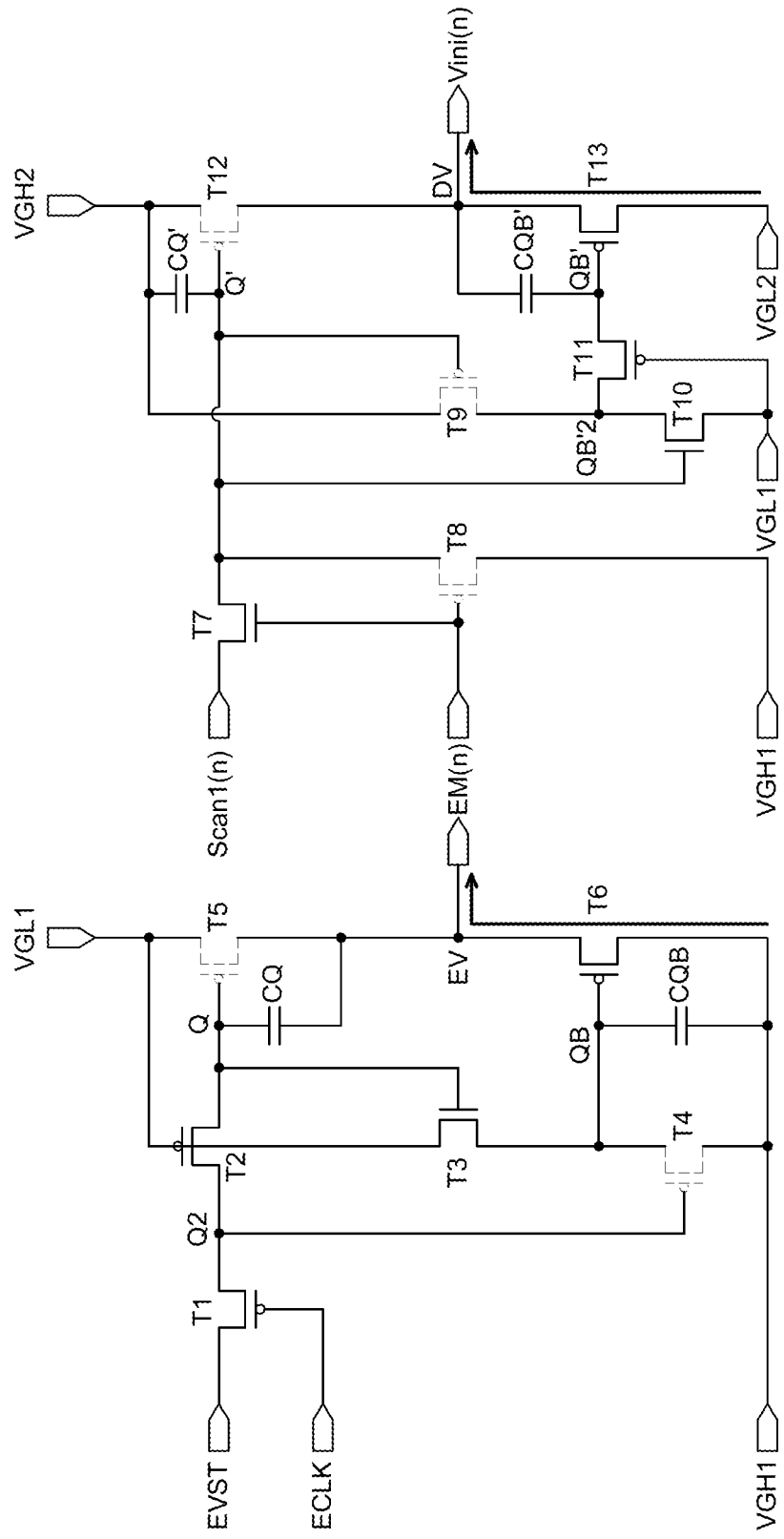
FIG. 7C is a circuit diagram of the gate driving circuit according to an embodiment of the present disclosure during period ③ of FIG. 6.

FIG. 6 is a waveform diagram of signals provided to the gate driving circuit of FIG. 5. FIG. 7A is a circuit diagram of the gate driving circuit according to an embodiment of the present disclosure during periods ①, ⑤, and ⑦ of FIG. 6. FIG. 7B is a circuit diagram of the gate driving circuit according to an embodiment of the present disclosure during periods ②, ④, and ⑥ of FIG. 6. FIG. 7C is a circuit diagram of the gate driving circuit according to an embodiment of the present disclosure during period ③ of FIG. 6. In this case, the gate driving circuit specifically means the gate signal generating circuit.

As described above, the electroluminescent display device 100 according to an embodiment of the present disclosure may be driven dividedly in a refresh frame and an anode reset frame. In explaining driving of the emission signal generating circuit EDC(n) and the initialization signal generating circuit VDC(n), the refresh frame may be divided into periods of ①, ②, ③, ④, and ⑤, and the anode reset frame may be divided into periods of ⑤, ⑥, and ⑦.

FIGS. 5, 6, and 7A show the driving of the emission signal generating circuit EDC(n) and the initialization signal generating circuit VDC(n) during the periods ①, ⑤, and ⑦ where the emission element EL emits light. During the periods ①, ⑤, and ⑦, the emission signal generating circuit EDC(n) outputs the emission signal EM(n) at a low level, and the initialization signal generating circuit VDC(n) also outputs the initialization signal Vini(n) at a low level.

In the periods ①, ⑤, and ⑦ of the refresh frame and the anode reset frame, the Q2 node controller Q2C provides a low level voltage to the Q2 node. The Q2 node controller Q2C is controlled by a clock signal ECLK and provides the start signal EVST or an emission signal EM(n−1) of a previous row to the Q2 node. The Q2 node controller Q2C may be implemented as a first transistor T1. The first transistor T1 may be a p-type MOSFET (PMOS) and may be implemented as a low-temperature polycrystalline silicon (LTPS) thin film transistor. In this case, since the start signal EVST and the clock signal ECLK are at a low level, the Q2 node controller Q2C is turned on and transmits the low level to the Q2 node. And, even when the clock signal ECLK is switched to a high level, the Q2 node maintains the low level.

In the periods ①, ⑤, and ⑦ of the refresh frame and the anode reset frame, the Q node maintenance unit QS electrically connects the Q node and the Q2 node. The Q node maintenance unit QS is controlled by a first low voltage VGL1 and electrically connects the Q node and the Q2 node. The Q node maintenance unit QS may be implemented as a second transistor T2. The second transistor T2 may be a p-type MOSFET (PMOS) and may be implemented as a low-temperature polycrystalline silicon (LTPS) thin film transistor. Since the first low voltage VGL1 is applied to a gate electrode of the second transistor T2, the second transistor T2 maintains a turned-on state all the time and electrically connects the Q node and the Q2 node.

In the periods ①, ⑤, and ⑦ of the refresh frame and the anode reset frame, the first pull-down unit PDE applies the first low voltage VGL1 to a first output node EV. The first pull-down unit PDE is controlled by the Q node and provides the first low voltage VGL1 to the first output node EV. The first pull-down unit PDE may be implemented as a fifth transistor T5 and a Q node capacitor CQ. The fifth transistor T5 may be a p-type MOSFET (PMOS) and may be implemented as a low-temperature polycrystalline silicon (LTPS) thin film transistor. The Q node capacitor CQ is connected to a gate electrode and a drain electrode of the fifth transistor T5. The Q node capacitor CQ rapidly applies the first low voltage VGL1 to the first output node EV through a bootstrapping effect. Since the first output node EV is connected to a line to which the emission signal EM(n) is provided, the emission signal EM(n) is the first low voltage VGL1 in the periods ①, ⑤, and ⑦.

Meanwhile, in the periods ①, ⑤, and ⑦ of the refresh frame and the anode reset frame, the Q node inverter QI provides a reversal voltage of the Q node to the QB node, so that the QB node becomes in a high level state. The Q node inverter QI includes a third transistor T3 and a fourth transistor T4. The third transistor T3 may be an n-type MOSFET (NMOS) and may be implemented as an oxide thin film transistor, and the fourth transistor T4 may be a p-type MOSFET (PMOS) and may be implemented as a low-temperature polycrystalline silicon (LTPS) thin film transistor. The third transistor T3 is turned off by the low level of the Q node, and the fourth transistor T4 is turned on by the low level of the Q2 node. The turned-on fourth transistor T4 applies a first high voltage VGH1 to the QB node. That is, in the periods ①, ⑤, and ⑦, the Q node is at a low level and the QB node is at a high level by the Q node inverter QI.

In the periods ①, ⑤, and ⑦ of the refresh frame and the anode reset frame, the first pull-up unit PUE is controlled by the QB node and blocks the first high voltage VGH1 to the first output node EV. The first pull-up unit PUE may be implemented as a sixth transistor T6 and a QB node capacitor CQB. The sixth transistor T6 may be a p-type MOSFET (PMOS) and may be implemented as a low-temperature polycrystalline silicon (LTPS) thin film transistor. The QB node capacitor CQB is connected to a gate electrode and a source electrode of the sixth transistor T6. The first pull-up unit PUE is turned off by the first high voltage VGH1 of the QB node and does not apply the first high voltage VGH1 to the first output node EV.

In the periods ①, ⑤, and ⑦ of the refresh frame and the anode reset frame, the emission signal inverter EI is controlled by the emission signal EM(n) and provides a voltage having a phase opposite to that of the emission signal EM(n) to the Q' node. The emission signal inverter EI may be implemented as a seventh transistor T7 and an eighth transistor T8. The seventh transistor T7 may be an n-type MOSFET (NMOS) and may be implemented as an oxide thin film transistor, and the eighth transistor T8 may be a p-type MOSFET (PMOS) and may be implemented as a low-temperature polycrystalline silicon (LTPS) thin film transistor. The seventh transistor T7 is controlled by the emission signal EM(n) and provides the first scan signal Scan1(n) to the Q' node, and the eighth transistor T8 is controlled by the emission signal EM(n) and provides the first high voltage VGH1 to the Q' node. In the periods ①, ⑤, and ⑦, the emission signal EM(n) is the first low voltage VGL1 and the first scan signal Scan1(n) is at a low level, so that the seventh transistor T7 is turned off and the eighth transistor T8 is turned on. Accordingly, the emission signal inverter EI provides the first high voltage VGH1 having a phase opposite to that of the emission signal EM(n) of the first low voltage VGL1 to the Q' node.

In the periods ①, ⑤, and ⑦ of the refresh frame and the anode reset frame, the second pull-up unit PUV is controlled by the Q' node and blocks a second high voltage VGH2 to a second output node DV. The second pull-up unit PUV may be implemented as a twelfth transistor T12 and a Q' node capacitor CQ'. The twelfth transistor T12 may be a p-type MOSFET (PMOS) and may be implemented as a low-temperature polycrystalline silicon (LTPS) thin film transistor. The Q' node capacitor CQ' is connected to a gate electrode and a source electrode of the twelfth transistor T12. The second pull-up unit PUV is turned off by the first high voltage VGH1 of the Q' node and does not apply the second high voltage VGH2 to the second output node DV.

In the periods ①, ⑤, and ⑦ of the refresh frame and anode reset frame, since the Q' node inverter Q'I provides a reversal voltage of the Q' node to the QB'2 node, the QB'2 node becomes in a low level state. The Q' node inverter Q'I includes a ninth transistor T9 and a tenth transistor T10. The ninth transistor T9 may be a p-type MOSFET (PMOS) and may be implemented as a low-temperature polycrystalline silicon (LTPS) thin film transistor, and the tenth transistor T10 may be an n-type MOSFET (NMOS) and may be implemented as an oxide thin film transistor. The ninth transistor T9 is turned off by the first high voltage VGH1 of the Q' node, and the tenth transistor T10 is turned on by the first high voltage VGH1 of the Q' node. The turned-on tenth transistor T10 applies the first low voltage VGL1 to the QB '2 node. That is, in the periods ①, ⑤, and ⑦, the Q' node is at the high level (or is the first high voltage VGH1), and the QB'2 node is at the low level (or is the first low voltage VGL1) by the Q' node inverter Q'I.

In the periods ①, ⑤, and ⑦ of the refresh frame and the anode reset frame, the QB' node maintenance unit QB'S electrically connects the QB' node and the QB'2 node. The QB' node maintenance unit QB'S is controlled by the first low voltage VGL1 and electrically connects the QB' node and the QB'2 node. The QB' node maintenance unit QB'S may be implemented as an eleventh transistor T11. The eleventh transistor T11 may be a p-type MOSFET (PMOS) and may be implemented as a low-temperature polycrystalline silicon (LTPS) thin film transistor. Since the first low voltage VGL1 is provided to a gate electrode of the eleventh transistor T11, the eleventh transistor T11 maintains a turned-on state all the time and electrically connects the QB' node and the QB'2 node. Since the QB'2 node is in a state of the first low voltage VGL1 by the Q' node inverter Q'I in the periods ①, ⑤, and ⑦, the QB' node also becomes the first low voltage VGL1 by the QB' node maintenance unit QB'S.

In the periods ①, ⑤, and ⑦ of the refresh frame and the anode reset frame, the second pull-down unit PDV applies a second low voltage VGL2 to the second output node DV. The second pull-down unit PDV is controlled by the QB' node and provides the second low voltage VGL2 to the second output node DV. The second pull-down unit PDV may be implemented as a thirteenth transistor T13 and a QB' node capacitor CQB'. The thirteenth transistor T13 may be a p-type MOSFET (PMOS) and may be implemented as a low-temperature polycrystalline silicon (LTPS) thin film transistor. The QB' node capacitor CQB' is connected to a gate electrode and a drain electrode of the thirteenth transistor T13. The QB' node capacitor CQB' rapidly applies the second low voltage VGL2 to the second output node DV through a bootstrapping effect. Since the second output node DV is connected to a line to which the initialization signal Vini(n) is provided, the initialization signal Vini(n) is the second low voltage VGL2 in the periods ①, ⑤, and ⑦.

The first low voltage VGL1 and the first high voltage VGH1 are respectively used as driving voltages for driving the gate driving circuit and may be referred to as a low level and a high level. On the other hand, the second low voltage VGL2 and the second high voltage VGH2 are voltages different from the first low voltage VGL1 and the first high voltage VGH1, respectively, and are used as voltages for implementing the initialization signal Vini(n). Accordingly, the second high voltage VGH2 is lower than the first high voltage VGH1 and is a voltage at a level similar to that of a black voltage in order to have an effect on the on bias stress of the transistor. In addition, the second low voltage VGL2 is higher than the first low voltage VGL1 and is a voltage at a level similar to that of the low potential driving voltage VSS.

Referring to FIGS. 5, 6, and 7B, in which driving of the emission signal generating circuit EDC(n) and the initialization signal generating circuit VDC(n) during the periods of ②, ④, and ⑥ is shown. An on-bias voltage is applied to the driving transistor in the periods of ②, ④, and ⑥. During the periods ②, ④, and ⑥, the emission signal generating circuit EDC(n) outputs the emission signal EM(n) of a high level, and the initialization signal generating circuit VDC(n) also outputs the initialization signal Vini(n) of a high level.

In the periods ②, ④, and ⑥ of the refresh frame and the anode reset frame, the Q2 node controller Q2C provides a high level voltage to the Q2 node. The Q2 node controller Q2C is controlled by the clock signal ECLK and provides the start signal EVST or the emission signal EM(n−1) of the previous row to the Q2 node. In this case, since the clock signal ECLK is at a low level and the start signal EVST is at a high level, the Q2 node controller Q2C is turned on and transmits the high level to the Q2 node.

Even in the periods ②, ④, and ⑥ of the refresh frame and the anode reset frame, the Q node maintenance unit QS electrically connects the Q node and the Q2 node.

In the periods ②, ④, and ⑥ of the refresh frame and the anode reset frame, the first pull-down unit PDE is controlled by the Q node and blocks the first low voltage VGL1. The first pull-down unit PDE is turned off by the high level voltage of the Q node and does not apply the first low voltage VGL1 to the first output node EV.

Meanwhile, in the periods ②, ④, and ⑥ of the refresh frame and the anode reset frame, since the Q node inverter QI provides a reversal voltage of the Q node to the QB node, the QB node becomes in a low level state. The third transistor T3 constituting the Q node inverter QI is turned on by the high level of the Q node, and the fourth transistor T4 is turned off by the high level of the Q2 node. The turned-on third transistor T3 applies the first low voltage VGL1 to the QB node. That is, in the periods ②, ④, and ⑥, the Q node is at a high level, and the QB node becomes at a low level by the Q node inverter QI.

In the periods ②, ④, and ⑥ of the refresh frame and the anode reset frame, the first pull-up unit PUE is controlled by the QB node and transmits the first high voltage VGH1 to the first output node EV. The sixth transistor T6 constituting the first pull-up unit PUE is turned on by the first low voltage VGL1 of the QB node and applies the first high voltage VGH1 to the first output node EV. The QB node capacitor CQB rapidly applies the first high voltage VGH1 to the first output node EV through a bootstrapping effect and maintains a voltage of the QB node to the first low voltage VGL1. Since the first output node EV is connected to the line to which the emission signal EM(n) is provided, the emission signal EM(n) is the first high voltage VGH1 in the periods ②, ④, and ⑥.

In the periods ②, ④, ⑥ of the refresh frame and the anode reset frame, the emission signal inverter EI is controlled by the emission signal EM(n) and provides the first scan signal Scan(1) to the Q' node. The seventh transistor T7 constituting the emission signal inverter EI is turned on by the first high voltage VGH1 of the emission signal EM(n) and provides the first scan signal Scan1($n$) to the Q' node, and the eighth transistor T8 is turned off by the first high voltage VGH1 of the emission signal EM(n). Since the first scan signal Scan1($n$) is a low level voltage in the periods ②, ④, and ⑥, the emission signal inverter EI provides the first scan signal Scan(1) of the low level voltage to the Q' node.

In the periods ②, ④, and ⑥ of the refresh frame and the anode reset frame, the second pull-up unit PUV is controlled by the Q' node and transmits the second high voltage VGH2 to the second output node DV. The twelfth transistor T12 constituting the second pull-up unit PUV is turned on by the low level voltage of the Q' node and applies the second high voltage VGH2 to the second output node DV. The Q' node capacitor CQ' may rapidly apply the second high voltage VGH2 to the second output node DV through a bootstrapping effect and may maintain the voltage of the Q' node to the low level voltage. Since the second output node DV is connected to the line to which the initialization signal Vini(n) is provided, the initialization signal Vini(n) is the second high voltage VGH2 in the periods ②, ④, and ⑥.

In the period ②, ④, ⑥ of the refresh frame and the anode reset frame, since the Q' node inverter Q'I provides a reversal voltage of the Q' node to the QB'2 node, the QB'2 node becomes in a high level state. The ninth transistor T9 constituting the Q' node inverter Q'I is turned on by the low level voltage of the Q' node and applies the second high voltage VGH2 to the QB '2 node, and the tenth transistor T10 is turned off by the low level voltage of the Q' node. That is, in the periods ②, ④, and ⑥, the Q' node is at a low level, and the QB '2 node becomes the second high voltage VGH2 by the Q' node inverter Q'I.

Even in the periods ②, ④, and ⑥ of the refresh frame and the anode reset frame, the QB' node maintenance unit QB'S electrically connects the QB' node and the QB'2 node. Since the QB'2 node is in a state of the second high voltage VGH2 by the Q' node inverter Q'I, the QB' node also becomes the second high voltage VGH2 by the QB' node maintenance unit QB'S.

In the periods ②, ④, and ⑥ of the refresh frame and the anode reset frame, the second pull-down unit PDV blocks the second low voltage VGL2. The thirteenth transistor T13 constituting the second pull-down unit PDV is turned off by the second high voltage VGH2 of the QB' node and does not apply the second low voltage VGL2 to the second output node DV.

FIGS. 5, 6, and 7C show driving of the emission signal generating circuit EDC(n) and the initialization signal generating circuit VDC(n) during period ③ where the gate electrode and the drain electrode of the driving transistor are initialized. During the ③ period, the emission signal generating circuit EDC(n) outputs the emission signal EM(n) of a high level, and the initialization signal generating circuit VDC(n) outputs the initialization signal Vini(n) of a low level.

In the period ③ of the refresh frame and the anode reset frame, the Q2 node controller Q2C maintains the high level voltage applied to the Q2 node in the period ②. And, since the Q node maintenance unit QS electrically connects the Q node and the Q2 node, the Q2 node is also at a high level.

In the period ③ of the refresh frame and the anode reset frame, the first pull-down unit PDE is blocked by the high level voltage of the Q node and does not apply the first low voltage VGL1 to the first output node EV.

In the period ③ of the refresh frame and the anode reset frame, since the Q node inverter QI provides a reversal voltage of the Q node to the QB node, the QB node becomes in a low level state. The third transistor T3 constituting the Q node inverter QI is turned on by the high level of the Q node, and the fourth transistor T4 is turned off by the high level of the Q2 node. The turned-on third transistor T3 applies the first low voltage VGL1 to the QB node. That is, in the period ③, the Q node is at a high level, and the QB node becomes at a low level by the Q node inverter QI.

In the period ③ of the refresh frame and the anode reset frame, the first pull-up unit PUE is controlled by the QB node and transmits the first high voltage VGH1 to the first output node EV. The sixth transistor T6 constituting the first pull-up unit PUE is turned on by the first low voltage VGL1 of the QB node and applies the first high voltage VGH1 to the first output node EV. The QB node capacitor CQB maintains the QB node to the first low voltage VGL1 and continuously applies the first high voltage VGH1 to the first output node EV. Since the first output node EV is connected to the line to which the emission signal EM(n) is provided, the emission signal EM(n) is the first high voltage VGH1 in the period ③.

In the period ③ of the refresh frame and the anode reset frame, the emission signal inverter EI is controlled by the emission signal EM(n) and provides the first scan signal Scan(1) to the Q' node. The seventh transistor T7 constituting the emission signal inverter EI is turned on by the first high voltage VGH1 of the emission signal EM(n) and provides the first scan signal Scan1($n$) to the Q' node, and the eighth transistor T8 is turned off by the first high voltage VGH1 of the emission signal EM(n). In the period ③, since the emission signal EM(n) is the first high voltage VGH1, the seventh transistor T7 is turned on and the eighth transistor T8 is turned off. And, the first scan signal Scan1(n) is at a high level. Accordingly, the emission signal inverter EI provides the first scan signal Scan1(n) of the high level to the Q' node.

In the period ③ of the refresh frame and the anode reset frame, the second pull-up unit PUV is controlled by the Q' node and blocks the second high voltage VGH2 to the second output node DV. The twelfth transistor T12 constituting the second pull-up unit PUV is turned off by the high level voltage of the Q' node and does not apply the second high voltage VGH2 to the second output node DV.

In the period ③ of the refresh frame and the anode reset frame, since the Q' node inverter Q'I provides a reversal voltage of the Q' node to the QB'2 node, the QB'2 node becomes in a low level state. The ninth transistor T9 constituting the Q' node inverter Q'I is turned off by the high level voltage of the Q' node, and the tenth transistor T10 is turned on by the high level voltage of the Q' node. The turned-on tenth transistor T10 applies the first low voltage VGL1 to the QB'2 node. That is, in the period ③, the Q' node is at a high level, and the QB'2 node becomes the first low voltage VGL1 by the Q' node inverter Q'I.

Even in the period ③ of the refresh frame and the anode reset frame, the QB' node maintenance unit QB'S electrically connects the QB' node and the QB'2 node. Since the QB'2 node is in a state of the first low voltage VGL1 by the Q' node inverter Q'I in the period ③, the QB' node also becomes the first low voltage VGL1 by the QB' node maintenance unit QB'S.

In the period ③ of the refresh frame and the anode reset frame, the second pull-down unit PDV applies the second low voltage VGL2 to the second output node DV. The second pull-down unit PDV is controlled by the QB' node and provides the second low voltage VGL2 to the second output node DV. The thirteenth transistor T13 constituting the second pull-down unit PDV is turned on and provides the second low voltage VGL2 to the second output node DV. In addition, the QB' node capacitor CQB' rapidly applies the second low voltage VGL2 to the second output node DV through a bootstrapping effect, and maintains the voltage of the QB' node to the first low voltage VGL1. Since the second output node DV is connected to the line to which the initialization signal Vini(n) is provided, the initialization signal Vini(n) is the second low voltage VGL2 in the period ③.

The embodiments of the present disclosure can also be described as follows:

According to an aspect of the present disclosure, there is provided an electroluminescent display device. The electroluminescent display device includes a pixel circuit implemented with a plurality of transistors, and a gate driving circuit that provides a scan signal, an initialization signal, and an emission signal to the pixel circuit. The gate driving circuit includes a scan signal generating circuit that provides the scan signal to a gate electrode of at least one of the plurality of transistors, an initialization signal generating circuit that provides the initialization signal to a source electrode or a drain electrode of at least one of the plurality of transistors, and an emission signal generating circuit that provides the emission signal to the gate electrode of at least one of the plurality of transistors. The initialization signal generating circuit receives an output signal of the scan signal generating circuit and an output signal of the emission signal generating circuit. The initialization signal generating circuit and the emission signal generating circuit include an n-type transistor and a p-type transistor.

The emission signal generating circuit may include a first pull-down unit controlled by a Q node and a first pull-up unit controlled by a QB node, the QB node may be coupled to a Q node inverter that provides a reversal voltage of the Q node to the QB node.

The initialization signal generating circuit may include a second pull-up unit controlled by a Q' node and a second pull-down unit controlled by a QB' node, the QB' node is coupled to a Q' node inverter that provides a reversal voltage of the Q' node to the QB' node, the Q' node inverter is coupled to an emission signal inverter that provides the output signal of the scan signal generating circuit or a voltage having a phase opposite to that of the output signal of the emission signal generating circuit to the Q' node.

The plurality of transistors may include at least one n-type transistor and at least one p-type transistor.

The scan signal generating circuit may be coupled to a gate electrode of the at least one n-type transistor.

The emission signal generating circuit may be coupled to a gate electrode of the at least one p-type transistor.

The initialization signal generating circuit may be connected to a source electrode or a drain electrode of another p-type transistor other than the p-type transistor coupled to the emission signal generating circuit.

The initialization signal may be a signal swinging between a high level and a low level within one frame.

The electroluminescent display device may further include a plurality of pixel lines each including a plurality of pixel circuits. The gate driving circuit may include a first gate driving circuit and a second gate driving circuit. The first gate driving circuit may include a first scan signal generating circuit that provides a scan signal for sampling a threshold voltage of a driving transistor, a second scan signal generating circuit that provides for controlling a data voltage to be applied to the pixel circuit, and a third scan signal generating circuit that provides a scan signal for controlling the initialization signal to be provided to the pixel circuit. The second gate driving circuit may include the emission signal generating circuit, the second scan signal generating circuit, and the initialization signal generating circuit. The first gate driving circuit and the second gate driving circuit may share the second scan signal generating circuit coupled to an odd-numbered pixel circuit included in one pixel line and the second scan signal generating circuit coupled to an even-numbered pixel circuit in the one pixel line.

According to another aspect of the present disclosure, there is provided a gate driving circuit. The gate driving circuit includes a first pull-down unit controlled by a Q node, a first pull-up unit controlled by a QB node, a second pull-up unit controlled by a Q' node, a second pull-down unit controlled by a QB' node, a Q node inverter electrically connected to the Q node and the QB node to provide a reversal voltage of the Q node to the QB node, a Q' node inverter electrically connected to the Q' node and the QB' node to provide a reversal voltage of the Q' node to the QB' node, and an emission signal inverter electrically connected to the Q' node to provide a scan signal or a voltage having a phase opposite to that of an emission signal to the Q' node. The first pull-down unit and the first pull-up unit output the emission signal. The second pull-up unit and the second pull-down unit output an initialization signal.

The first pull-down unit may be coupled to a line to which a first low voltage is provided. The first pull-up unit may be coupled to a line to which a first high voltage is provided. The second pull-up unit may be coupled to a line to which a second high voltage is provided. The second pull-down unit may be coupled to a line to which a second low voltage is provided.

The gate driving circuit may further include a Q node maintenance unit electrically connecting the Q node inverter to the Q node.

The Q node maintenance unit may be controlled by the first low voltage provided from the line coupled to the first pull-down unit and electrically connects the Q node and a Q2 node. The Q node inverter may include an n-type transistor controlled by the Q node and a p-type transistor controlled by the Q2 node.

The gate driving circuit may further include a Q2 node controller coupled to the Q2 node, the Q2 node controller may be controlled by a clock signal and may provide a start signal or an emission signal output from a previous row to the Q2 node.

The gate driving circuit may further include a QB' node maintenance unit electrically connecting the Q' node inverter to the QB' node.

The Q' node inverter may be controlled by the Q' node and may include an n-type transistor and a p-type transistor that are coupled at the QB'2 node. The n-type transistor may be coupled to a line to which the first low voltage is provided, and the p-type transistor may be coupled to a line to which the second high voltage is provided.

The QB' node maintenance unit may be controlled by the first low voltage provided from the line coupled to the n-type transistor and may electrically connect the QB' node and the QB'2 node.

The gate driving circuit may further include a scan signal generating circuit for outputting the scan signal. The emission signal inverter may include a p-type transistor and an n-type transistor controlled by the emission signal.

Each of the first pull-down unit, the first pull-up unit, the second pull-up unit, and the second pull-down unit may include a p-type transistor and a capacitor coupling a gate electrode of the p-type transistor, and a drain electrode or a source electrode of the p-type transistor.

The second high voltage may be lower than the first high voltage. The second low voltage may be higher than the first low voltage.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
a pixel circuit implemented with a plurality of transistors, and a gate driving circuit that provides a scan signal, an initialization signal, and an emission signal to the pixel circuit,
wherein the gate driving circuit disposed in a non-display area includes:
a scan signal generating circuit that provides the scan signal to a gate electrode of at least one of the plurality of transistors;
an initialization signal generating circuit that provides the initialization signal to a source electrode or a drain electrode of at least one of the plurality of transistors; and
an emission signal generating circuit that provides the emission signal to the gate electrode of at least one of the plurality of transistors,
wherein the initialization signal generating circuit is electrically and directly coupled to the scan signal generating circuit and the emission signal generating circuit,
wherein the initialization signal generating circuit receives the scan signal of the scan signal generating circuit and the emission signal of the emission signal generating circuit and provides the initialization signal based on the scan signal of the scan signal generating circuit and the emission signal of the emission signal generating circuit, and
wherein the initialization signal generating circuit and the emission signal generating circuit include an n-type transistor and a p-type transistor.

2. The electroluminescent display device of claim 1, wherein the emission signal generating circuit includes a first pull-down unit controlled by a Q node and a first pull-up unit controlled by a QB node, wherein the QB node is coupled to a Q node inverter that provides a reversal voltage of the Q node to the QB node.

3. The electroluminescent display device of claim 1, wherein the initialization signal generating circuit includes a second pull-up unit controlled by a Q' node and a second pull-down unit controlled by a QB' node,
wherein the QB' node is coupled to a Q' node inverter that provides a reversal voltage of the Q' node to the QB' node, and
wherein the Q' node inverter is coupled to an emission signal inverter that provides the output signal of the scan signal generating circuit or a voltage having a phase opposite to that of the output signal of the emission signal generating circuit to the Q' node.

4. The electroluminescent display device of claim 1, wherein the plurality of transistors includes at least one n-type transistor and at least one p-type transistor.

5. The electroluminescent display device of claim 4, wherein the scan signal generating circuit is coupled to a gate electrode of the at least one n-type transistor.

6. The electroluminescent display device of claim 4, wherein the emission signal generating circuit is coupled to a gate electrode of the at least one p-type transistor.

7. The electroluminescent display device of claim 4, wherein the initialization signal generating circuit is coupled to a source electrode or a drain electrode of another p-type transistor other than the p-type transistor coupled to the emission signal generating circuit.

8. The electroluminescent display device of claim 1, wherein the initialization signal is a signal swinging between a high level and a low level within one frame.

9. The electroluminescent display device of claim 1, further comprising:
- a plurality of pixel lines each including a plurality of pixel circuits,
- wherein the gate driving circuit includes a first gate driving circuit and a second gate driving circuit,
- wherein the first gate driving circuit includes:
  - a first scan signal generating circuit that provides a scan signal for sampling a threshold voltage of a driving transistor;
  - a second scan signal generating circuit that provides a scan signal for controlling a data voltage to be applied to the pixel circuit; and
  - a third scan signal generating circuit that provides a scan signal for controlling the initialization signal to be provided to the pixel circuit,
- wherein the second gate driving circuit includes:
  - the emission signal generating circuit;
  - the second scan signal generating circuit; and
  - the initialization signal generating circuit, and
- wherein the first gate driving circuit and the second gate driving circuit share the second scan signal generating circuit coupled to an odd-numbered pixel circuit included in one pixel line and the second scan signal generating circuit coupled to an even-numbered pixel circuit in the one pixel line.

* * * * *